US006956270B2

(12) United States Patent
Fukuzumi

(10) Patent No.: US 6,956,270 B2
(45) Date of Patent: Oct. 18, 2005

(54) MAGNETIC MEMORY DEVICE HAVING A PLURALITY OF MAGNETO-RESISTANCE EFFECT ELEMENTS ARRANGED IN A MATRIX FORM AND METHOD FOR MANUFACTURING THE SAME

(75) Inventor: Yoshiaki Fukuzumi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/771,548

(22) Filed: Feb. 5, 2004

(65) Prior Publication Data

US 2005/0040447 A1 Feb. 24, 2005

(30) Foreign Application Priority Data

Aug. 20, 2003 (JP) ........................................ 2003-208089

(51) Int. Cl.[7] .......................... H01L 29/82; H01L 43/00
(52) U.S. Cl. ...................... 257/421; 365/158; 365/171; 365/173
(58) Field of Search ......................... 257/421; 365/171, 365/173, 158

(56) References Cited

U.S. PATENT DOCUMENTS

| 6,005,800 A | 12/1999 | Koch et al. | |
|---|---|---|---|
| 6,621,731 B2 * | 9/2003 | Bessho et al. | 365/171 |
| 6,795,335 B2 * | 9/2004 | Hidaka | 365/158 |
| 2002/0080645 A1 * | 6/2002 | Liu et al. | 365/158 |
| 2005/0063221 A1 * | 3/2005 | Motoyoshi | 365/158 |

OTHER PUBLICATIONS

Roy Scheuerlein, et al., "A 10ns Read and Write Non–Volatile Memory Array Using a Magnetic Tunnel Junction and FET Switch in each Cell", Digest of Technical Papers, IEEE International Solid–State Circuits Conference, Session 7 / TD: Emerging Memory & Device Technologies, Feb. 8, 2000, pp. 128–129.

Masashige Sato, et al., "Spin–Valve–Like Properties of Ferromagnetic Tunnel Junctions", Jpn. J. Appl. Phys., vol. 36 Part 2, No. 2B, Feb. 15, 1997, pp. L200–L201.

U.S. Appl. No. 10/771,548, filed Feb. 5, 2004, Fukuzumi.
U.S. Appl. No. 10/895,074, filed Jul. 21, 2004, Fukuzumi et al.

* cited by examiner

*Primary Examiner*—Ngân V. Ngô
(74) *Attorney, Agent, or Firm*—Oblon, Spivak, McClelland, Maier & Neustadt, P.C.

(57) ABSTRACT

A magnetic memory device comprises a plurality of magneto-resistance effect elements arranged in a matrix form. The each of a plurality of magneto-resistance effect elements have a pattern shape which substantially internally touches an ellipse having major and minor axes of the magneto-resistance effect element as major and minor axes thereof and a pitch between the adjacent magneto-resistance effect elements in a direction of the major axis is longer than that in a direction of the minor axis.

6 Claims, 11 Drawing Sheets

MAGNETIC MEMORY DEVICE HAVING A PLURALITY OF MAGNETO-RESISTANCE EFFECT ELEMENTS ARRANGED IN A MATRIX FORM AND METHOD FOR MANUFACTURING THE SAME

CROSS-REFERENCE TO RELATED APPLICATIONS

This application is based upon and claims the benefit of priority from prior Japanese Patent Application No. 2003-208089, filed Aug. 20, 2003, the entire contents of which are incorporated herein by reference.

BACKGROUND OF THE INVENTION

1. Field of the Invention

This invention relates to a magnetic memory device and a method for manufacturing the same which can be applied to an MRAM or the like, for example.

2. Description of the Related Art

A magnetic random access memory (which is hereinafter simply referred to as an MRAM) is a general name of a solid-state memory which can rewrite, hold and read out memory information at any time by using a magnetization direction of a ferromagnetic body as an information storage medium.

The memory cell of the MRAM generally has a structure in which a plurality of ferromagnetic members are laminated. The information recording operation is performed by setting binary information item "1" or "0" to respectively correspond to the state in which the relative arrangement of magnetization of a plurality of ferromagnetic members is set to the parallel or anti-parallel arrangement. The memory information writing operation is performed by inverting the magnetization direction of the ferromagnetic members of each cell by use of a current magnetic field generated by causing a current to flow into one of write lines arranged in a cross stripe form. The MRAM is a nonvolatile memory in which the power consumption at the storage information holding time is principally zero and the storage information holding operation is performed even after the power supply is cut off. The memory information readout operation is performed by utilizing a so-called magneto-resistance effect or a phenomenon that the electrical resistance of the memory cell varies according to a relative angle of the magnetization direction of the ferromagnetic member configuring the cell with respect to a sense current or a relative angle of magnetization between a plurality of ferromagnetic layers.

For example, the MRAM is advantageous in the following respects when the function thereof is compared with that of the conventional semiconductor memory using a dielectric member.

(1) The MRAM is a complete nonvolatile memory and the rewriting operation can be performed by $10^{15}$ times or more.

(2) The non-destructive readout can be performed and the refresh operation is not required so that the readout cycle can be shortened.

(3) The resistance to radioactive rays is strong in comparison with that of the charge storage memory.

It is predicted that the integration density per unit area, writing time and readout time of the MRAM can be set approximately equal to those of the DRAM. Therefore, it is expected that the MRAM can be applied to an external memory device of a mobile equipment, LSI hybrid device or a main storage memory of a personal computer by making use of the significant feature of the nonvolatile characteristic.

As the MRAM which is studied for practical application at present, an MTJ element using ferro-magnetic tunnel junction (which is hereinafter referred to as MTJ) in a memory cell is provided. The above MRAM is described in ISSCC 2000 (Digest Paper TA7.2 A 10 ns Read and Write Non-Volatile Memory Array Using a Magnetic Tunnel Junction and FET Switch in each Cell).

The MTJ element has a three-layered structure mainly formed of a ferromagnetic layer/insulating layer/ferromagnetic layer and a current tunnels and flows through the insulating layer. The junction resistance varies in proportion to cosine of a relative angle of magnetizations of the two ferromagnetic metal layers and is set to a maximum value when the magnetizations are set anti-parallel. This is the tunnel magneto-resistance effect and a magnetic resistance variation rate exceeding 25% is observed in a weak magnetic field of 50 Oe or less in $NiFe/Co/Al_2O/Co/NiFe$, for example. As the structure of the MRAM, a coercive force difference type structure which holds data by use of a difference of coercive forces of the two ferromagnetic layers is known. Further, a so-called spin valve structure in which an anti-ferromagnetic member is arranged adjacent to one of the ferromagnetic layers and the magnetization direction is fixed in order to improve the magnetic field sensitivity or reduce a write current is known. The above MRAM is described in Jpn. J. Appl. Phys. Vol. 36, L200, 1997 (Spin-Valve-Like Properties of Ferromagnetic Tunnel Junction).

BRIEF SUMMARY OF THE INVENTION

A magnetic memory device according to one aspect of the invention comprises a plurality of magneto-resistance effect elements arranged in a matrix form, wherein each of the plurality of magneto-resistance effect elements has a pattern shape which substantially internally touches an ellipse having major and minor axes of the magneto-resistance effect element as major and minor axes thereof and a pitch between the adjacent magneto-resistance effect elements in a direction of the major axis is longer than that in a direction of the minor axis.

A manufacturing method of a magnetic memory device according to another aspect of the invention comprises forming a material used to form magneto-resistance effect elements on a main surface of a semiconductor substrate, forming a photoresist on the material used to form the magneto-resistance effect elements, respectively forming opening portions in the photoresist in central portions of forming regions of every four adjacent magneto-resistance effect elements, equally enlarging the opening portions by isotropically etching the opening portions and causing at least two end portions of the opening portion in a major axis direction and two end portions thereof in a minor axis direction to overlap with end portions of the adjacent opening portions in a major axis direction and end portions of the adjacent opening portions in a minor axis direction, and forming a plurality of magneto-resistance effect elements by etching the material used to form the magneto-resistance effect elements with the remaining photoresist used as a mask.

DETAILED DESCRIPTION OF THE INVENTION

There will now be described an embodiment of this invention with reference to the accompanying drawings. In the explanation, common reference symbols are attached to like portions throughout the drawings.

Figure 1:
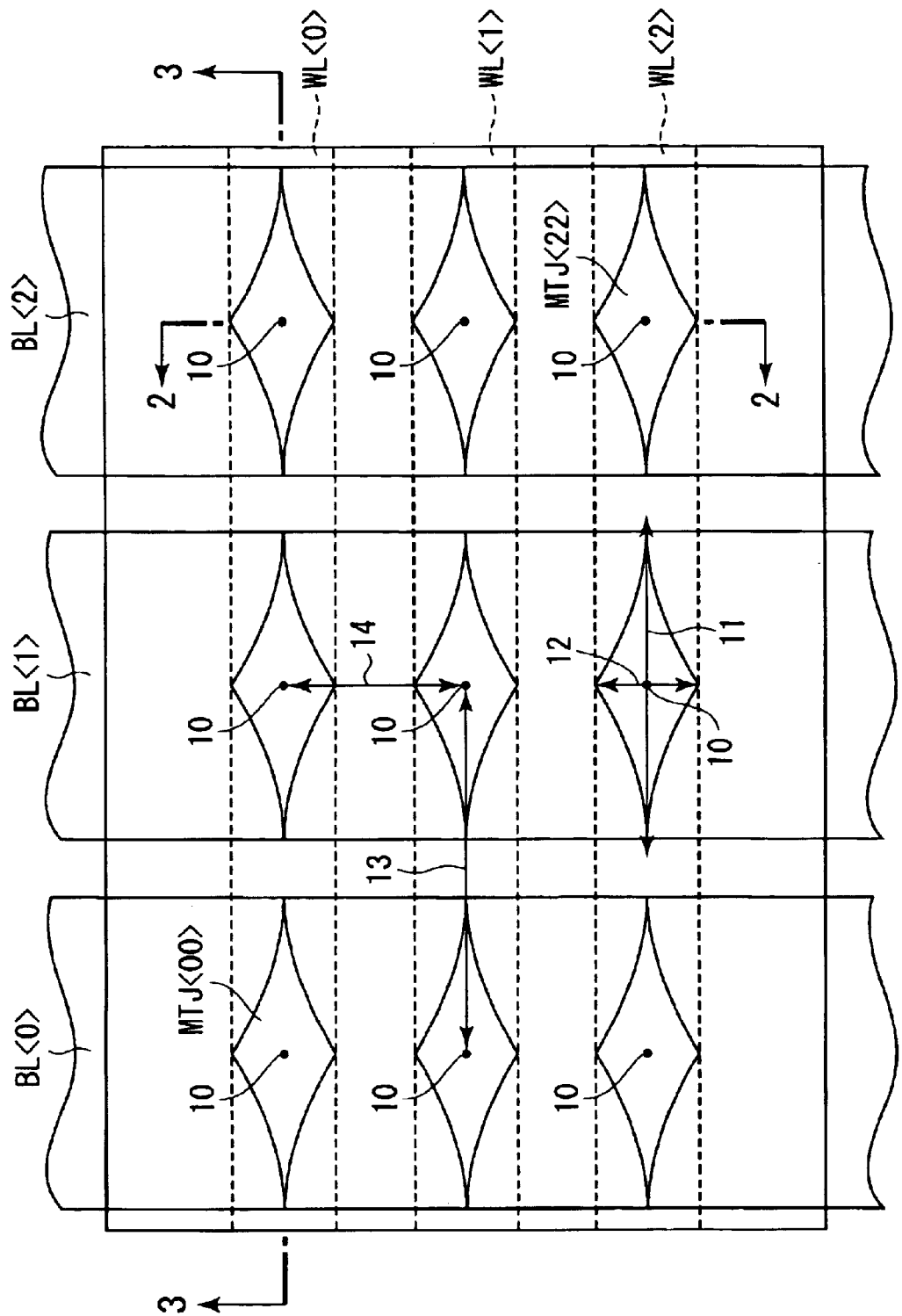
FIG. 1 is a plan view schematically showing a magnetic memory device according to one embodiment of this invention.
Figure 2:
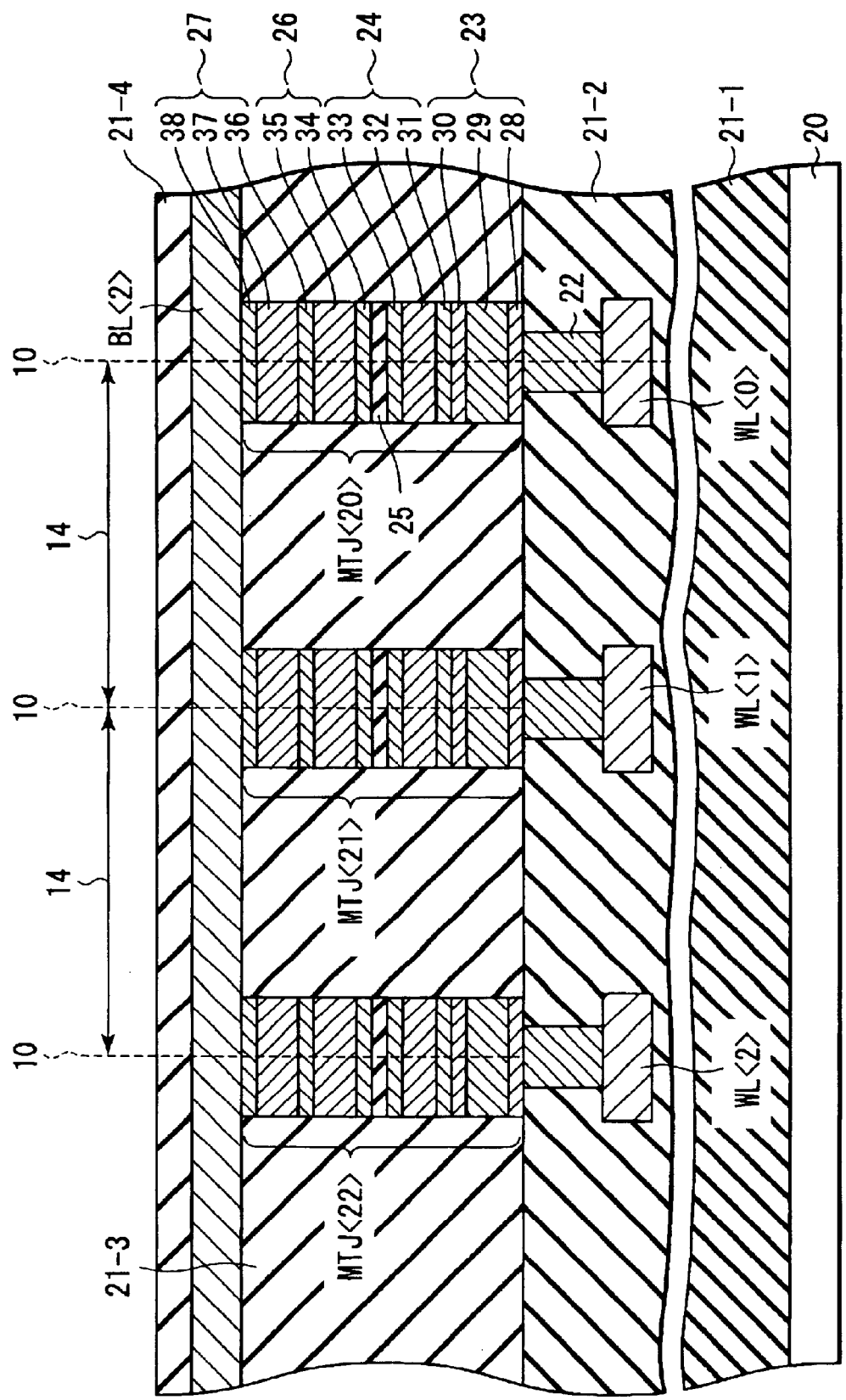
FIG. 2 is a cross-sectional view taken along the 2—2 line of FIG. 1 and viewed in the arrow direction.
Figure 3:
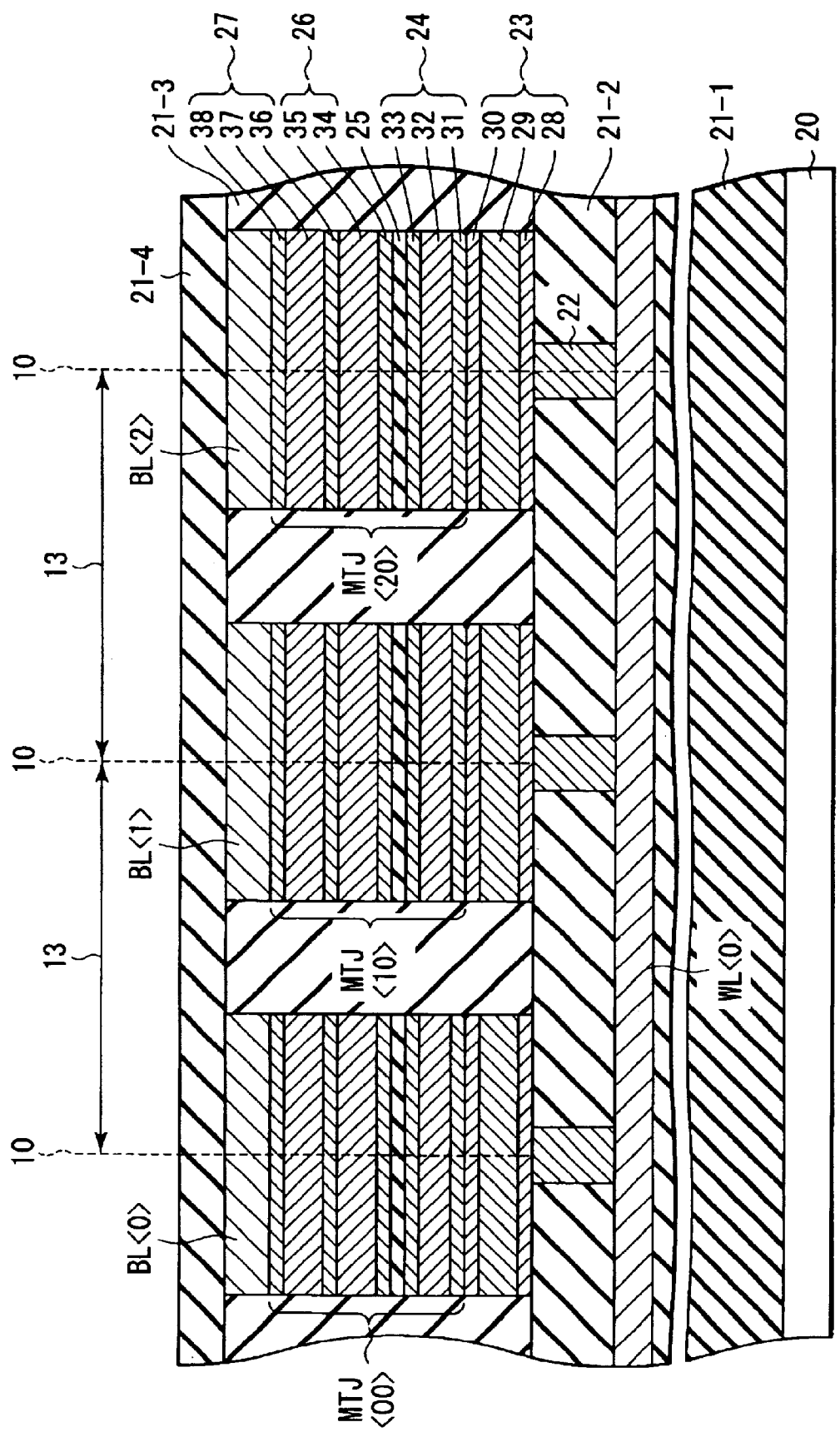
FIG. 3 is a cross-sectional view taken along the 3—3 line of FIG. 1 and viewed in the arrow direction.
Figure 4:
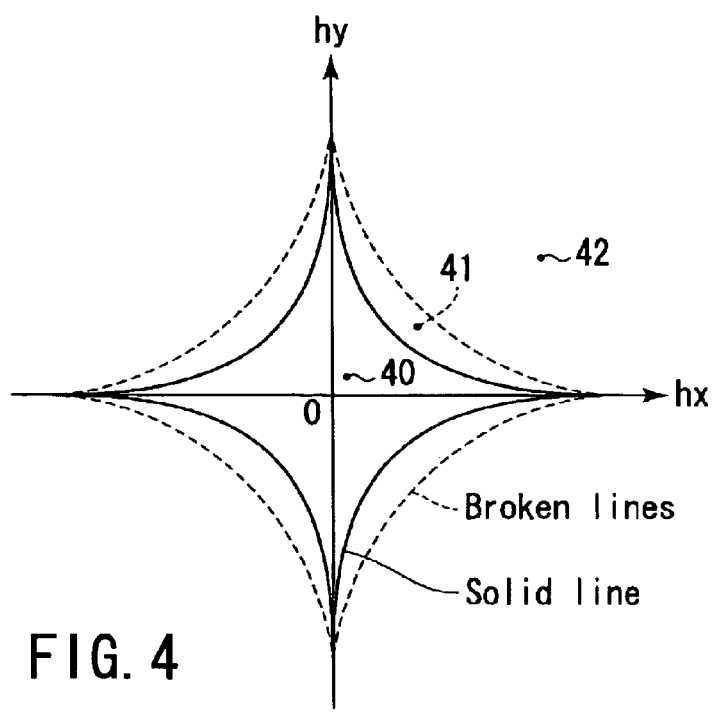
FIG. 4 is a diagram showing asteroid curves of an MTJ element having an external form of an ellipse and an MTJ element having an external form according to one embodiment of this invention.

A magnetic memory device according to one embodiment of this invention is explained with reference to FIGS. 1 to 4. FIG. 1 is a plan view schematically showing an example of a memory cell array of a magnetic memory device according to one embodiment of this invention. FIG. 2 is a cross-sectional view taken along the 2—2 line of FIG. 1 and viewed in the arrow direction. FIG. 3 is a cross-sectional view taken along the 3—3 line of FIG. 1 and viewed in the arrow direction. FIG. 4 is a diagram showing asteroid curves of an MTJ element having an external form of an ellipse and an MTJ element having a form according to the embodiment.

First, the plan configuration and cross-sectional configuration of the magnetic memory device according to the above embodiment are explained with reference to FIGS. 1 to 3. In this case, <nm> (n, m are integral numbers) shown in FIG. 1 indicates <row column>.

As shown in FIGS. 1 to 3, word lines WL (WL<0> to WL<2>) are formed to extend in a row direction and bit lines BL (BL<0> to BL<2>) are formed to extend in a column direction on the main surface of a semiconductor substrate 20. A plurality of MTJ elements (MTJ<00> to MTJ<22>) are formed at respective intersections of the word lines WL and the bit lines BL and arranged in a matrix form. Further, inter-level insulating films 21-1 to 21-4 are formed to fill spaces between the MTJ elements on the main surface of the semiconductor substrate 20. The MTJ elements are formed on the inter-level insulating film 21-2 and each includes a ground conductive layer 23, fixing layer (pin layer) 24, tunnel barrier layer 25, recording layer (free layer) 26 and cap layer 27.

For example, the ground conductive layer 23 is formed by laminating a Ta layer 28, Al layer 29 and Ta layer 30. For example, the fixing layer 24 is formed by laminating a NiFe layer 31, IrMn layer 32 and CoFe layer 33 on the Ta layer 30. For example, the recording layer 26 is formed by laminating a CoFe layer 34 and NiFe layer 35 on the tunnel barrier layer 25 which is formed of, for example, $Al_2O_3$. The cap layer 27 is formed by laminating a Ta layer 28, Al layer 29 and Ta layer 30 on the NiFe layer 35, for example.

Contact plugs 22 are formed in the inter-level insulating film 21-2 to connect the MTJ elements to the corresponding word lines WL. The contact plug 22 is formed by, for example, filling W (tungsten) into a contact hole. Further, the inter-level insulating films 21-1 to 21-4 are each formed of an $SiO_2$ film, for example.

As shown in FIG. 1, the shape of each of the MTJ elements (MTJ<00> to MTJ<22>) is formed by inwardly concaving the outer periphery of an ellipse having a major axis 11 and minor axis 12 of each MTJ element as major and minor axes thereof. Therefore, the area of the MTJ element having the major axis 11 and minor axis 12 is formed to be smaller than that of an ellipse having the major axis 11 and minor axis 12 as the major and minor axes thereof. The centers 10 of the MTJ elements are at the intersections of the major axes 11 and minor axes 12.

Further, as shown in FIGS. 1 to 3, an interval (pitch) 13 between adjacent MTJ elements in a direction of the major axis 11 is set to be larger than an interval 14 between adjacent MTJ elements in a direction of the minor axis 12. In this case, the interval (pitch) indicates a distance between the centers of adjacent two of the MTJ elements which are repeatedly arranged. That is, it is a distance between the centers 10 of the adjacent MTJ elements.

Next, the read/write operation of each MTJ element is explained by taking MTJ<00> as an example.

First, the read operation is explained. Generally, when information is read out from the MTJ element, the read operation is performed by detecting a variation in the resistance of the MTJ element. That is, when the spin directions of the fixing layer 24 and the recording layer 26 are set in the same direction, the resistivity of the MTJ element becomes minimum and, for example, a "1" state is set. Likewise, when the spin directions of the fixing layer 24 and the recording layer 26 are set in the opposite directions, the resistivity of the MTJ element becomes maximum and, for example, a "0" state is set. The spin direction of the fixing layer 24 is fixed and the spin direction of the recording layer 26 is not fixed. Therefore, the write operation is performed by exclusively inverting the spin direction of the recording layer 26.

In the readout operation, a current is caused to sequentially flow from the word line WL<0> through the contact plug 22, ground conductive layer 23, fixing layer 24, tunnel barrier layer 25, recording layer 26, cap layer 27 and bit line BL<0>. Then, a voltage value is detected by use of a sense amplifier (not shown) connected to the bit line BL<0>. Further, the resistance is detected based on the voltage value and thus the readout operation is completed.

Therefore, for example, when the spin direction of the fixing layer 24 of MTJ<00> and the spin direction of the recording layer 26 are set in parallel, the resistivity of MTJ<00> (the resistivity of a portion between the ground conductive layer 23 and the cap layer 27) becomes minimum. That is, for example, information is read out as the "1" state.

Next, the write operation is explained. The write operation is performed by inverting the spin direction of the recording layer 26 by use of a resultant magnetic field generated by the word line WL and bit line BL. First, if a current is caused to flow through the word line WL<0>, a magnetic field is generated around the word line WL<0> according to the so-called corkscrew rule. Then, the spin direction of the recording layer 26 of each MTJ element (MTJ<00>, MTJ<01>, MTJ<02>) on the word line WL<0> is set in a direction of the minor axis 12 by the action of the magnetic field generated from the word line WL<0>. Further, if a current is caused to flow through the bit line BL<0>, a magnetic field is generated around the bit line BL<0> in the same manner as described above. Then, only the spin direction of the recording layer 26 of MTJ<00> is inverted by a resultant magnetic field of a magnetic field generated from the bit line BL<0> and a magnetic field generated from the word line WL<0>.

Therefore, for example, if the write operation is performed to set the spin direction of the fixing layer 24 of MTJ<00> and the spin direction of the recording layer 26 into an anti-parallel state, the resistivity of MTJ<00> becomes maximum. That is, for example, information is read out as the "0" state. The above operation is applied to the other MTJ elements (MTJ<01> to MTJ<22>).

Next, the asteroid curve having a shape of the MTJ element according to this embodiment is explained with reference to FIG. 4. FIG. 4 is a graph showing asteroid curves of an MTJ element having an external form of an ellipse and an MTJ element having an external form according to the embodiment. Broken lines shown in FIG. 4 indicate an asteroid curve of an MTJ element having an external form of an ellipse and the solid line indicates an asteroid curve of an MTJ element having an external form according to the embodiment. The MTJ element having the asteroid curve indicated by the broken lines in FIG. 4 is the MTJ element having the external form of the ellipse having the major axis 11 and minor axis 12 shown in FIG. 1 as the major axis and minor axis thereof.

Next, the asteroid curve is explained. It is assumed that the strength of the critical magnetic field at which the direction along the major axis 11 of the MTJ element shown in FIG. 1 is inverted (switched) is hx and the strength of the critical magnetic field in a direction along the minor axis 12 is hy. The asteroid curve of the solid line shown in FIG. 4 is formed by plotting hx, hy on the plane. In the asteroid curve of the solid line, if a resultant vector of magnetic fields applied to the recording layers 26 of the MTJ element lies within an internal region (a region containing an origin 0) which is surrounded by the asteroid curve, the spin direction of the recording layer 26 is not inverted. On the other hand, if the resultant vector lies in an external region (a region which does not contain the origin 0) outside the asteroid curve, the spin direction of the recording layer 26 is inverted. Therefore, it generally means that the critical magnetic field required for inversion becomes weaker and the write current is reduced if the area of the region surrounded by the asteroid curve becomes smaller.

For example, since a point 40 shown in FIG. 4 lies within the internal region of the asteroid curve of the solid line, the spin direction of the recording layer 26 of the MTJ element is not inverted. However, since points 41 and 42 lie in the external region of the asteroid curve of the solid line, the spin direction of the recording layer 26 of the MTJ element is inverted. Further, as shown in FIG. 4, a region (a region containing the point 41) surrounded by the solid line and broken lines lies within the internal region of the asteroid curve of the broken lines. Therefore, the spin direction of the recording layer 26 of an MTJ element having an ellipse which has the major axis 11 and minor axis 12 shown in FIG. 1 as the major axis and minor axis thereof cannot be inverted in the region surrounded by the solid line and broken lines.

However, as shown in FIG. 1, the shape of the MTJ element (MTJ<00> to MTJ<22>) according to the embodiment is inwardly concaved with respect to an ellipse having the major axis 11 and minor axis 12 of the MTJ element as the major axis and minor axis thereof. In this case, the area of each MTJ element having the major axis 11 and minor axis 12 becomes smaller than the area of an ellipse having the major axis 11 and minor axis 12 as the major axis and minor axis thereof.

It is understood that the shape of the asteroid curve shown by the solid line in FIG. 4 is more "concaved" by having the above shape of the MTJ element. That is, the write magnetic field required when the write operation is performed in the hx direction and hy direction is weakened. Therefore, a write current required for generating the write magnetic field can be reduced. Further, since the write current can be reduced and the write operation margin for erroneous writing is enlarged, the selectivity of the MTJ element can be enhanced.

If the MTJ element is formed to have an internally concaved shape with respect to an ellipse having the major axis 11 and minor axis 12 of the MTJ element as the major axis and minor axis thereof, the distribution in which magnetization of the recording layer 26 of the MTJ element is converged in a direction towards the ends of the major axis of the element can be attained. Therefore, particularly, magnetic poles appearing on the ends of the MTJ element in the major axis direction become larger in comparison with a case wherein the MTJ element is formed in an elliptic form. As a result, magnetic interference between the adjacent MTJ elements in the direction of the major axis 11 becomes a problem and there occurs a possibility that the data holding characteristic will be lowered.

However, as shown in FIGS. 1 to 3, the interval (pitch) 13 between the adjacent MTJ elements in the direction of the major axis 11 is set to be longer than the interval 14 between the adjacent MTJ elements in the direction of the minor axis 12.

With the above configuration, the interval between the adjacent MTJ elements in the major axis direction becomes longer. Therefore, the above problem caused by the magnetic interference between the adjacent MTJ elements in the major axis direction can be avoided. Thus, a magnetic memory device which maintains the excellent data holding characteristic and is highly reliable can be provided.

For example, in an MRAM of the generation in which the design rule is 0.1 $\mu$m, assume that the major axis 11 and minor axis 12 of the MTJ element are respectively set to approximately 0.2 $\mu$m and 0.1 $\mu$m. Then, it is desirable that the distance between the adjacent MTJ elements in the minor axis direction be set to approximately 0.1 $\mu$m which is almost equal to the minimum processing size of the generation and the distance between the adjacent MTJ elements in the major axis direction be set to approximately 0.15 $\mu$m which is larger than 0.1 $\mu$m. In this case, it is desirable that the pitch (interval) of the adjacent MTJ elements be set to approximately 0.35 $\mu$m and 0.2 $\mu$m in the major axis direction and minor axis direction, respectively, and the pitch be longer in the major axis direction.

When an attempt is made to form the MTJ element having the shape as shown in FIGS. 1 to 3, a variation in the shape of the MTJ elements increases. Therefore, there occurs a possibility that a variation in the tunnel resistance of the MTJ element will increase. Specifically, the following problem may occur in the manufacturing process in some cases.

Figure 5:
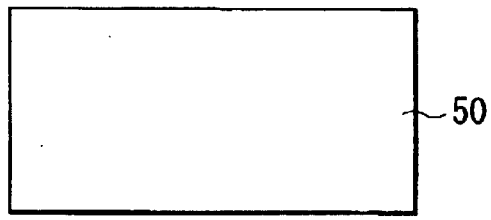
FIG. 5 is a plan view schematically showing a rectangular mask pattern used in a manufacturing method of the magnetic memory device according to the embodiment of this invention.
Figure 6A:
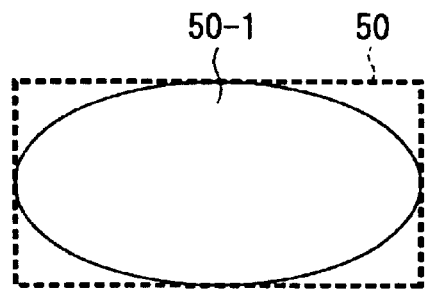
FIG. 6A is a plan view schematically showing a mask pattern having a rectangular shape whose corner portions are rounded and which is actually formed when the rectangular mask pattern shown in FIG. 5 is used.
Figure 7:
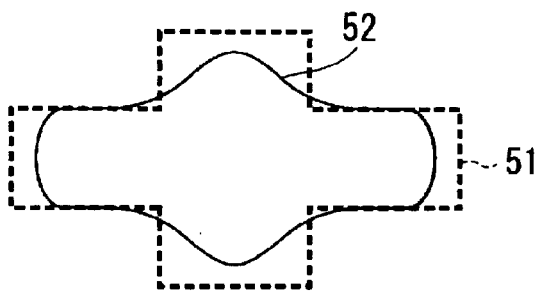
FIG. 7 is a plan view schematically showing a mask pattern which is actually formed when a cross-shaped mask pattern.
Figure 6B:
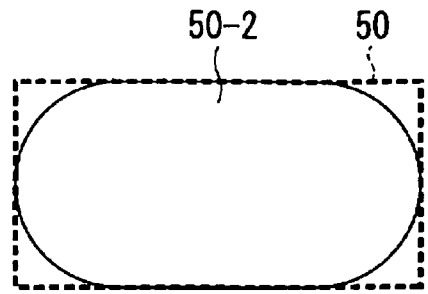
FIG. 6B is a plan view schematically showing a mask pattern having an elliptical shape which is actually formed when the rectangular mask pattern shown in FIG. 5 is used.

The problem is explained with reference to FIGS. 5, 6A, 6B and 7. FIG. 5 is a plan view schematically showing a rectangular mask pattern. FIG. 6A is a plan view schematically showing a mask pattern having a rectangular shape whose corner portions are rounded and which is actually formed when the rectangular mask pattern is used. FIG. 6B is a plan view schematically showing a mask pattern having an elliptical shape which is actually formed when the rectangular mask pattern is used. FIG. 7 is a plan view schematically showing a mask pattern which is actually formed when a cross-shaped mask pattern is used.

For example, when an MRAM having a scale of approximately 1 Gbit (gigabit) is manufactured, it is preferable to uniformly make the shapes of approximately 1-G MTJ elements. In this case, it is desirable that a pattern formed on the mask used in the lithography process be simple. Therefore, it is considered that the shape of a rectangular mask pattern 50 shown in FIG. 5, for example, is a preferable shape from the viewpoint of mask drawing and mask inspection. However, it is difficult to form the MTJ element having the complicated shape as shown in FIG. 1 if the rectangular mask pattern 50 as shown in FIG. 5 is used.

Further, when an MRAM having a scale of approximately 1 Gbit is manufactured, the shape of an actual pattern formed on the finished mask becomes a rectangular shape 50-2 whose corner portions are rounded as shown in FIG. 6B or an elliptical shape 50-1 as shown in FIG. 6A.

When the MTJ element having the shape as shown in FIG. 1 is formed, it is considered that a mask pattern is formed into a complicated shape as shown in FIG. 7, for example. As shown in FIG. 7, broken lines indicate a cross-shaped mask pattern 51 and the solid line indicates a mask pattern 52 actually formed when the cross-shaped mask pattern 51 is used.

However, even when the mask pattern 51 shown in FIG. 7 is used, the following problem occurs. First, if a projecting portion or the like of size smaller than the minimum processing size is provided to form an MTJ element having the minor axis of the length which is approximately equal to the minimum processing size, a processing variation will drastically increase. Further, in order to form a shape different from the simple shape on the mask, the complicated mask drawing process or complicated mask inspection process is required and, as a result, the total manufacturing cost is markedly increased. Therefore, it is difficult to form the MTJ elements which are inexpensive and have a uniform shape by use of the mask pattern 51 shown in FIG. 7.

The manufacturing method of the magnetic memory device according to one embodiment of this invention to solve the above problem is explained with reference to FIGS. 8A to 8C, FIGS. 9A to 9C and FIGS. 10A to 10C by taking the magnetic memory device shown in FIGS. 1 to 3 as an example.

Figure 8A:
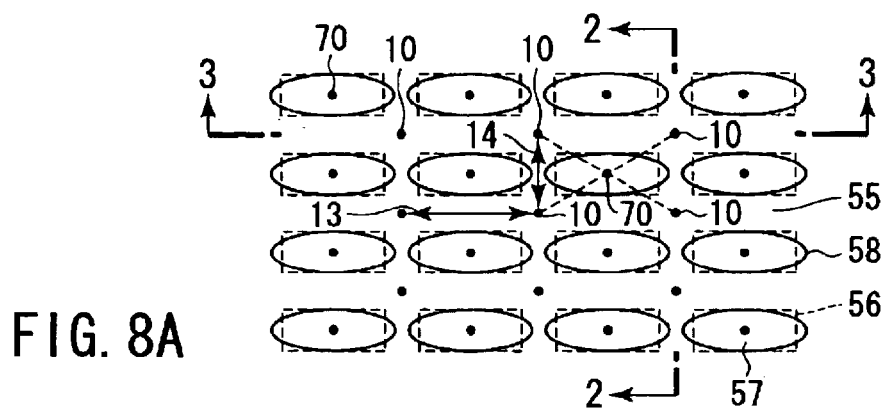
FIG. 8A is a plan view schematically showing a first step, for illustrating the manufacturing method of the magnetic memory device according to the embodiment of this invention.
Figure 8B:
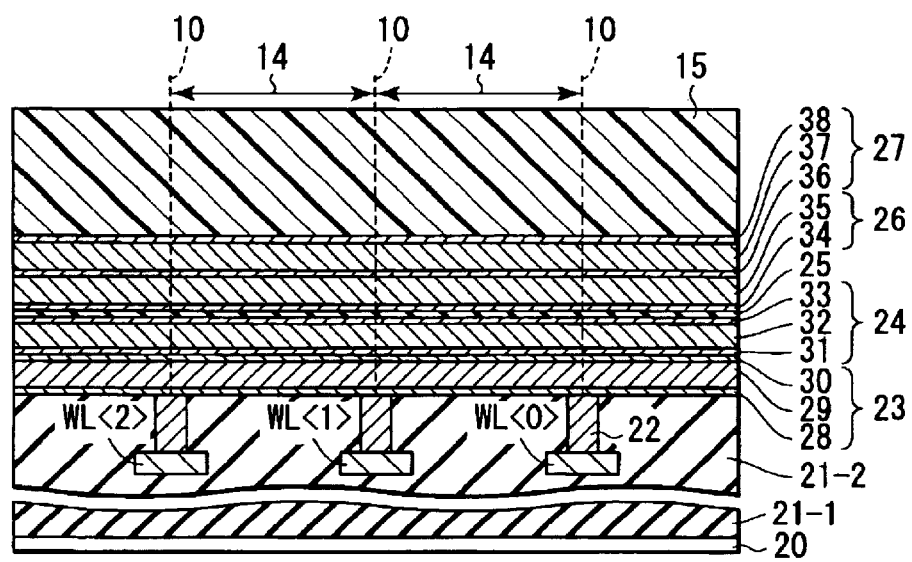
FIG. 8B is a cross-sectional view taken along the 2—2 line of FIG. 8A and viewed in the arrow direction.
Figure 8C:
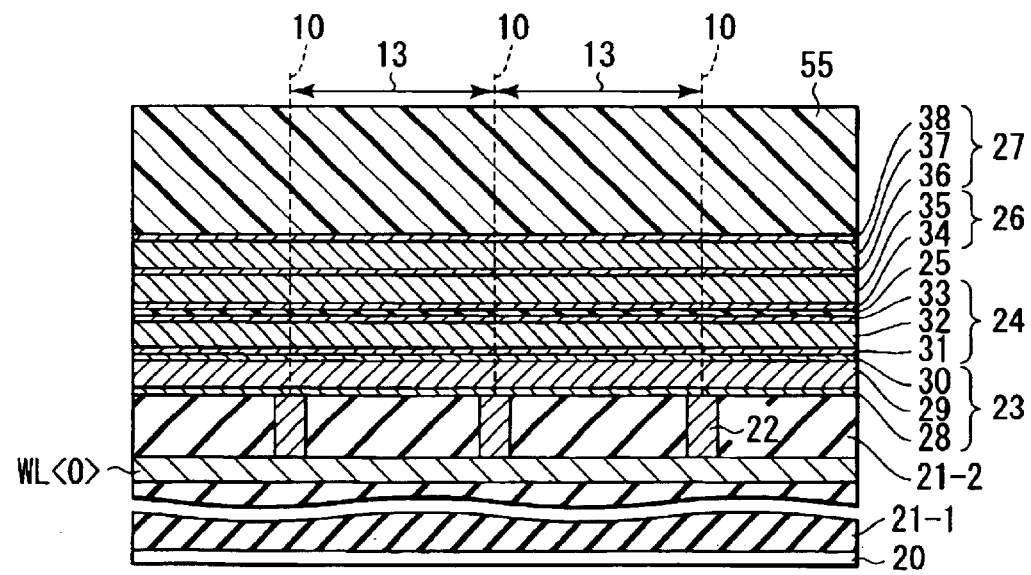
FIG. 8C is a cross-sectional view taken along the 3—3 line of FIG. 8A and viewed in the arrow direction.
Figure 9A:
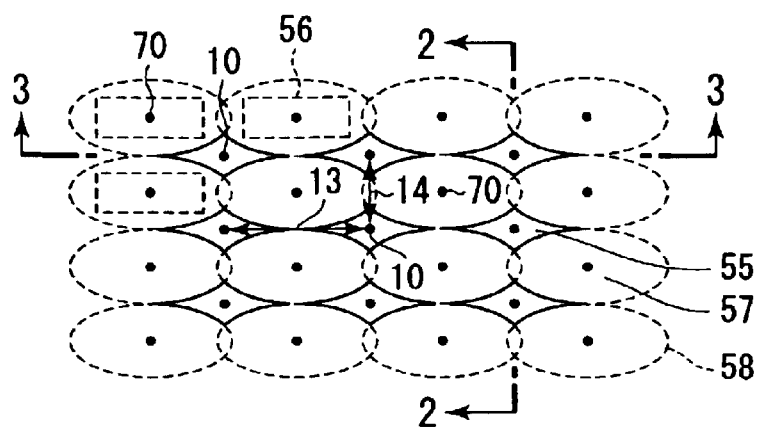
FIG. 9A is a plan view schematically showing a second step, for illustrating the manufacturing method of the magnetic memory device according to the embodiment of this invention.
Figure 9B:
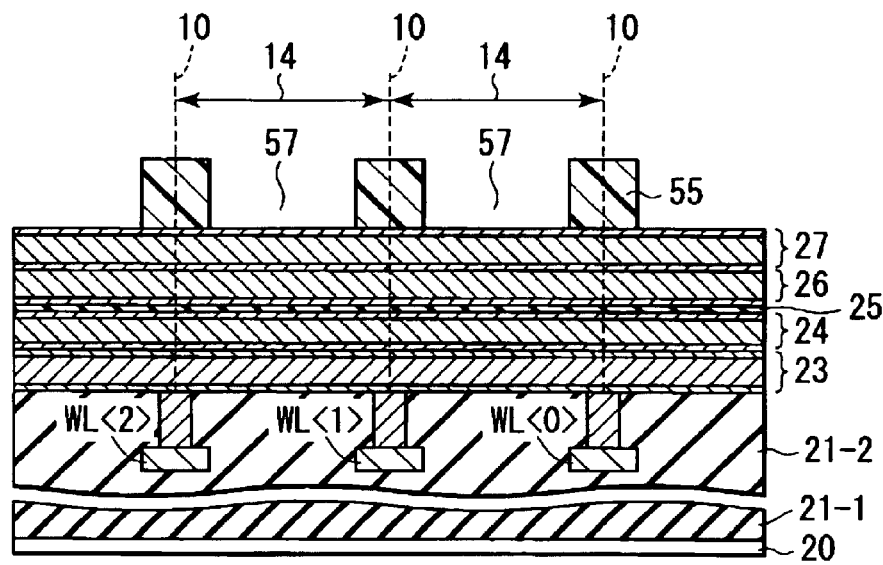
FIG. 9B is a cross-sectional view taken along the 2—2 line of FIG. 9A and viewed in the arrow direction.
Figure 9C:
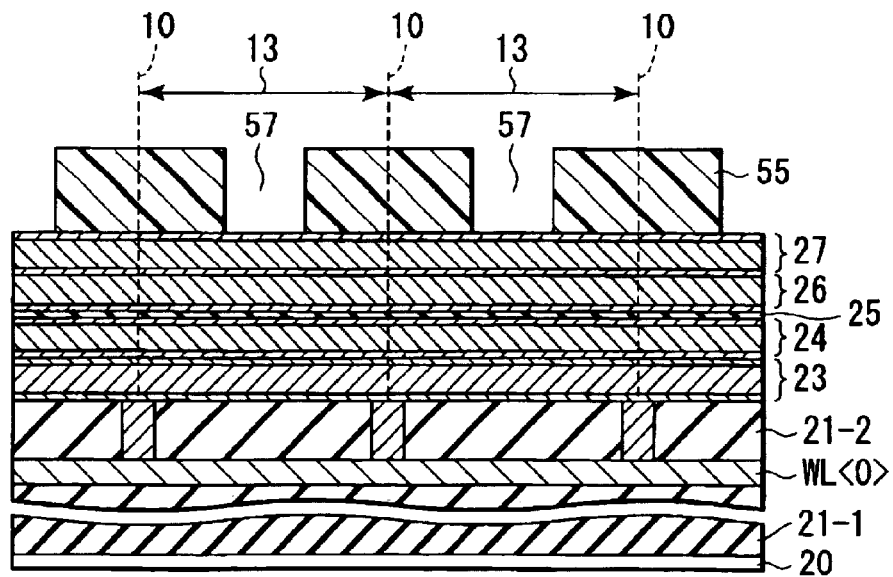
FIG. 9C is a cross-sectional view taken along the 3—3 line of FIG. 9A and viewed in the arrow direction.
Figure 10A:
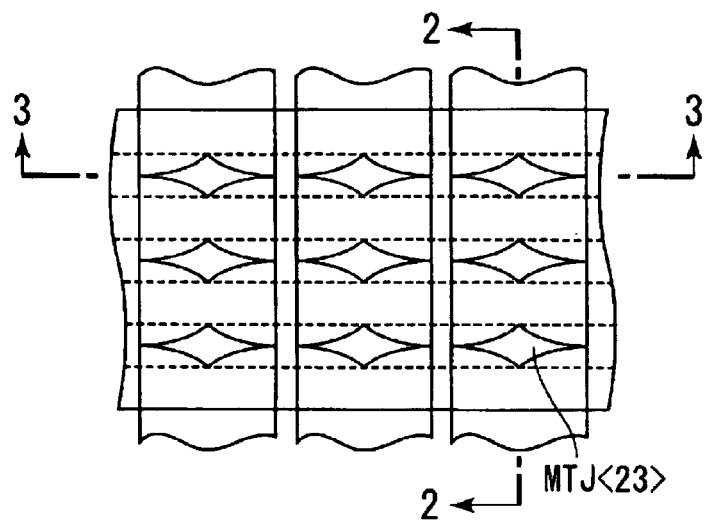
FIG. 10A is a plan view schematically showing a third step, for illustrating the manufacturing method of the magnetic memory device according to the embodiment of this invention.
Figure 10B:
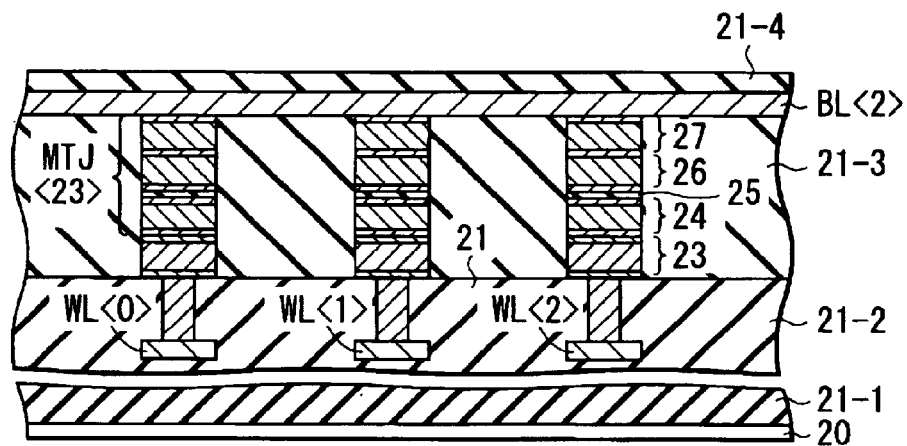
FIG. 10B is a cross-sectional view taken along the 2—2 line of FIG. 10A and viewed in the arrow direction.
Figure 10C:
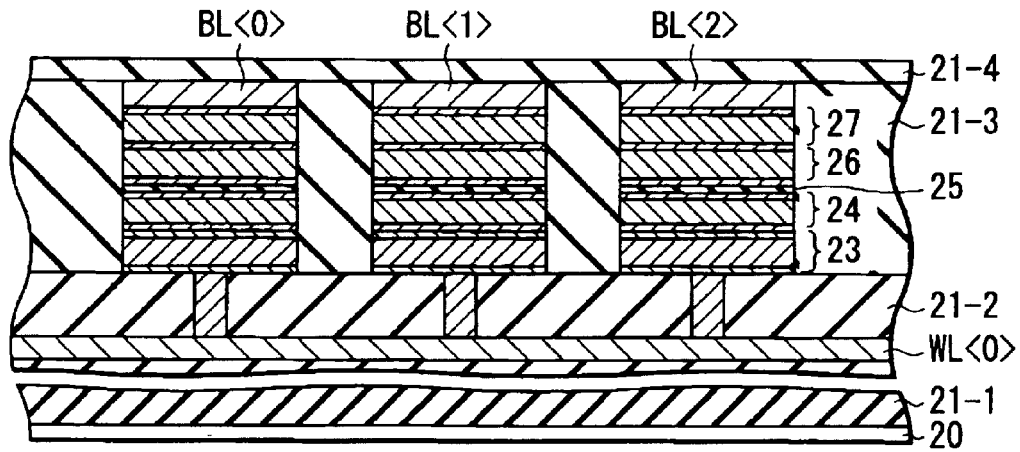
FIG. 10C is a cross-sectional view taken along the 3—3 line of FIG. 10A and viewed in the arrow direction.

FIGS. 8A, 9A, 10A are plan views schematically showing the manufacturing method of the magnetic memory device according to one embodiment of this invention. FIGS. 8B, 9B and 10B are cross-sectional views taken along the 2—2 lines of FIGS. 8A, 9A and 10A and viewed in the respective arrow directions. FIGS. 8C, 9C and 10C are cross-sectional views taken along the 3—3 lines of FIGS. 8A, 9A and 10A and viewed in the respective arrow directions.

First, as shown in FIGS. 8A to 8C, after various elements are formed in a semiconductor substrate 20, inter-level insulating films 21-1 and 21-2 are sequentially formed on the main surface of the substrate 20 by use of a CVD (Chemical Vapor Deposition) method, for example. Then, word lines WL (WL<0> to WL<2>) are formed in the row direction in the inter-level insulating film 21-2 by use of Al (aluminum), for example. Further, contact plugs 22 are formed in the inter-level insulating film 21-2 in an MTJ element forming region by use of W (tungsten), for example, so as to be respectively connected to the word lines WL. After this, the following laminated film, that is, a ground conductive layer 23, fixing layer 24, tunnel barrier layer 25, recording layer 26 and cap layer 27 which are used to form MTJ elements are sequentially formed on the entire surface of the inter-level insulating film 21-2 and contact plugs 22 by use of the CVD method, for example.

Next, a photoresist 55 is formed on the entire surface of the cap layer 27. Then, a rectangular mask patterns 56 having holes is laid on the photoresist 55, with the center of each hole aligned with the center 70 of the rectangle defined by four lines connecting the center 10 of every adjacent four MTJ elements. Using the mask patterns 56 thus positioned, photolithography is performed on the photoresist 55, thereby making opening portions 57 in the photoresist 55. At this time, the actual shape of the opening portions 57 becomes substantially an elliptic cylinder shape 58. The rectangular mask patterns 56 are used to leave behind portions of the photoresist 55 so that the interval (pitch) 13 between the adjacent MTJ elements in the major axis direction will become larger than the interval 14 between the adjacent MTJ elements in the minor axis direction.

Next, the photoresist 55 is uniformly and isotropically depressed or set back by use of a CDE (Chemical Dry Etching) method in an oxygen atmosphere, for example, as shown in FIGS. 9A to 9C.

In this step, the opening portions 57 each having the elliptic cylinder shape 58 and formed in the photoresist 55 are equally enlarged to cause at least two end portions in the major axis and two end portions in the minor axis of the opening portion 57 to respectively overlap with the end portions of the adjacent opening portions 57 in the major axis and the end portions thereof in the minor axis.

Therefore, portions of the photoresist 55 each having a pattern shape which is obtained by inwardly concaving an ellipse having the major and minor axes of an MTJ element used in the end as shown in FIG. 9A as the major and minor axes thereof are left behind.

Next, as shown in FIGS. 10A to 10C, the respective layers of the laminated film (cap layer 27, recording layer 26, tunnel barrier layer 25, fixing layer 24, ground conductive layer 23) which are used to form the MTJ elements are sequentially and selectively etched by an RIE (Reactive Ion Etching) method, for example, with the remaining portions of the photoresist 55 used as a mask. By the above process, the MTJ elements each having a shape of the concave portion (a convex curve projecting towards the internal portion of the MTJ element) are formed.

After this, for example, an $SiO_2$ film is formed on the entire surface as an inter-level insulating film 21-3 by the CVD method, for example. Further, the inter-level insulating film 21-3 is made flat by a CMP (Chemical Mechanical Polishing) method, for example. Then, bit lines BL (BL<0> to BL<2>) are formed to intersect with the word lines WL on the inter-level insulating film 21-3 on the MTJ elements. Next, an inter-level insulating film 21-4 is formed on the entire surface by the CVD method, for example.

By the above manufacturing process, the magnetic memory device shown in FIGS. 1 to 3 can be formed.

As shown in FIGS. 9A to 9C, the opening portions 57 are enlarged by equally depressing or setting back portions of the photoresist 55 by use of the rectangular patterns arranged in the adjacent positions. Thus, the photoresist of a region surrounded by the four adjacent ellipses is left behind to define the plane shape of the MTJ element. Therefore, the major and minor axes can be controlled by controlling the isotropically etching time.

By the above manufacturing method, MTJ elements having a desired shape can be formed only by use of the rectangular mask patterns. Therefore, mask formation and inspection can be simplified and the manufacturing cost can be lowered.

Further, in the normal manufacturing method, a case wherein a pattern shape of elements is formed by use of opening portions which are patterned in a photoresist, for example, is considered. However, as described above, in the present embodiment, the pattern shape of the magneto-resistance effect elements is formed by using the pattern shape of the remaining photoresist 55 as a mask.

Further, as shown in FIGS. 8A to 8C, the rectangular mask patterns 56 are formed by exposing and developing the photoresist 55 by the photolithography process, for example. In this case, the process is performed so as to make the interval (pitch) 13 between the adjacent MTJ elements in the major axis direction larger than the interval 14 between the adjacent MTJ elements in the minor axis direction.

By the above manufacturing method, the arrangement of the MTJ elements can be so set that the interval (pitch) between the adjacent MTJ elements will become long in the major axis direction of the MTJ element and become short in the minor axis direction of the MTJ element. Further, the exposure margin can be enlarged by making long the interval between the adjacent MTJ elements in the major axis direction. Therefore, a magnetic memory device which is inexpensive and highly reliable can be formed.

[Modification]

In the above embodiment, a case wherein the MTJ elements having the shape as shown in FIGS. 1 to 3 are used as an example is explained. However, it is considered to provide various modifications if the area of the shape of the MTJ element is smaller than the area of an ellipse having the major and minor axes of the MTJ element as the major and minor axes thereof. That is, for example, the shape of the MTJ element can be set to a shape having further concaved portions (a convex curve projecting towards the internal portion of the MTJ element) in comparison with the shape of the MTJ element of FIG. 1 or a shape which substantially internally touches an ellipse having the major and minor axes of the MTJ element as major and minor axes thereof. Even if the above shape is used, the same effect as that of the MTJ element shown in the above embodiment can be attained. Next, the modification thereof is explained with reference to FIGS. 11 and 12.

Figure 11:
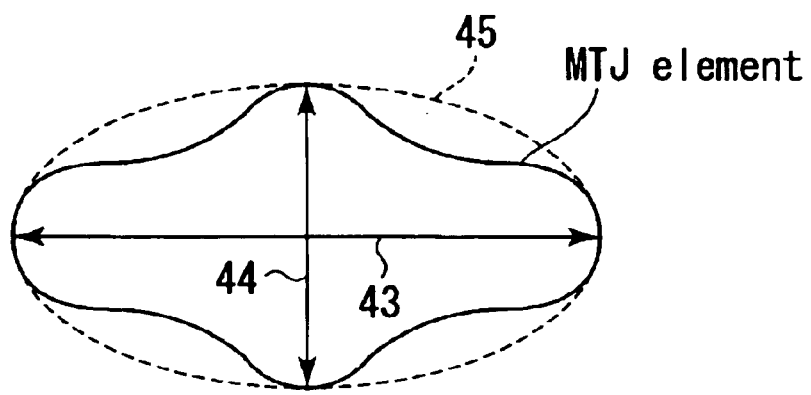
FIG. 11 is a plan view showing one example of an MTJ element having a concave shape (convex shape projecting to the internal portion of the MTJ element) according to one modification of this invention.
Figure 12:
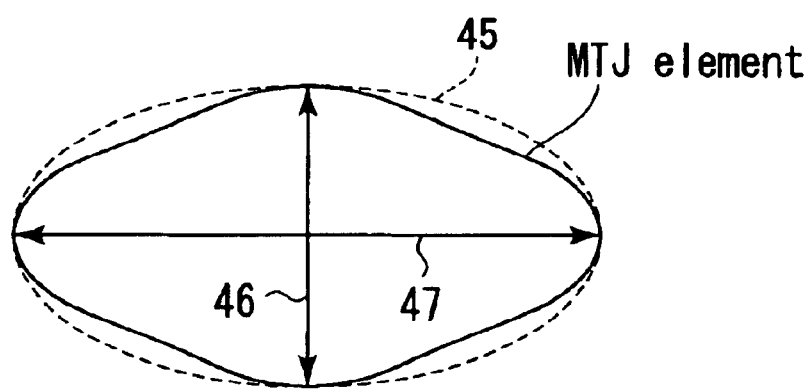
FIG. 12 is a plan view showing an MTJ element having a shape which substantially internally touches an ellipse having major and minor axes of the MTJ element in a modification of this invention as major and minor axes thereof.

FIG. 11 is a plan view showing one example of an MTJ element having a concave shape (a convex curve towards the internal portion of the MTJ element). FIG. 12 is a plan view showing an MTJ element having a shape which substantially internally touches an ellipse having the major and minor axes of the MTJ element as major and minor axes thereof. In explaining the modification, the drawing and explanation of portions which are common in the above embodiment are omitted.

First, as shown in FIG. 11, the solid line indicates the shape of an MTJ element having a major axis 43 and minor axis 44 and broken lines 45 indicate the shape of an ellipse having the major axis 43 and minor axis 44. The shape of the MTJ element indicated by the solid line has a concaved portion with respect to the shape of the ellipse having the major axis 43 and minor axis 44 indicated by the broken lines 45. Therefore, the area of the MTJ element indicated by the solid line becomes smaller than the area of the ellipse having the major axis 43 and minor axis 44.

With the above configuration, the asteroid curve of the MTJ element having the shape indicated by the solid line is more "concaved" in comparison with the asteroid curve of the MTJ element having the elliptic shape indicated by the broken lines 45. That is, like the above embodiment, a write current can be reduced. Further, since the write current can be reduced, the selectivity of the MTJ element is enhanced and the operation margin for erroneous writing can be enlarged.

Further, the interval between the adjacent MTJ elements in the direction of the major axis 43 shown in FIG. 11 is set to be longer than the interval between the adjacent MTJ elements in the direction of the minor axis 44 (not shown).

With the above configuration, the interval between the adjacent MTJ elements in the major axis direction becomes longer. Therefore, a problem of magnetic interference between the adjacent MTJ elements can be avoided and an excellent data holding characteristic can be maintained. As a result, a highly reliable MTJ element can be provided.

Even when the entire portion of the external shape of the MTJ element are not projected towards the internal portion thereof unlike the shape of the MTJ element shown in FIG. 11, the same effect as the above-described effect can be attained. That is, even when at least part of the external shape of the MTJ element is projected towards the internal portion thereof, the asterisk curve has a "concaved" shape in the above part.

FIG. 12 is a plan view showing one example of an MTJ element having a shape which substantially internally touches an ellipse having the major and minor axes of the MTJ element as major and minor axes thereof. The solid line shown in FIG. 12 indicates the shape of an MTJ element having a major axis 45 and minor axis 46 and broken lines 45 indicate the shape of an ellipse having the major axis 47 and minor axis 46.

As shown in FIG. 12, the shape of the MTJ element indicated by the solid line approximately internally touches the ellipse having the major axis 47 and minor axis 46 of the MTJ element as the major axis and minor axis thereof. Therefore, the area of the MTJ element indicated by the solid line becomes smaller than the area of the ellipse having the major axis 47 and minor axis 46.

Thus, like the above case, the write current can be reduced and the operation margin for erroneous writing can be enlarged. As a result, the selectivity of the MTJ element can be enhanced.

Further, the interval between the adjacent MTJ elements in the direction of the major axis 45 shown in FIG. 12 is set to be longer than the interval between the adjacent MTJ elements in the direction of the minor axis 46 (not shown).

With the above configuration, a problem of magnetic interference between the adjacent MTJ elements can be avoided and an excellent data holding characteristic can be maintained. As a result, a highly reliable MTJ element can be provided.

Next, a manufacturing method of a magnetic memory device according to one modification of this invention is explained with reference to FIGS. 13A to 15C.

Figure 13A:
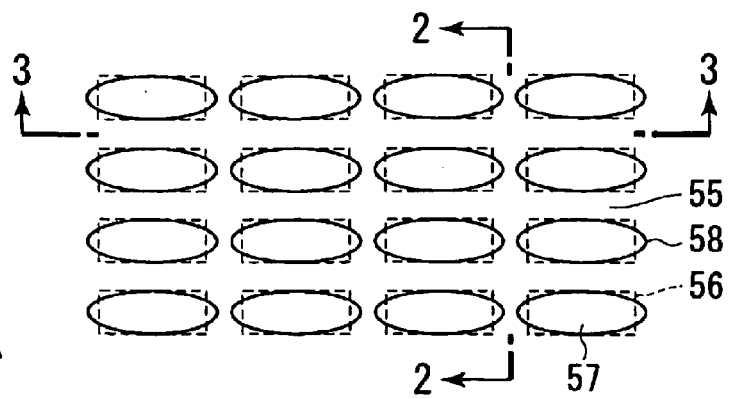
FIG. 13A is a plan view schematically showing a first step, for illustrating a manufacturing method of a magnetic memory device according to one modification of this invention.
Figure 13B:
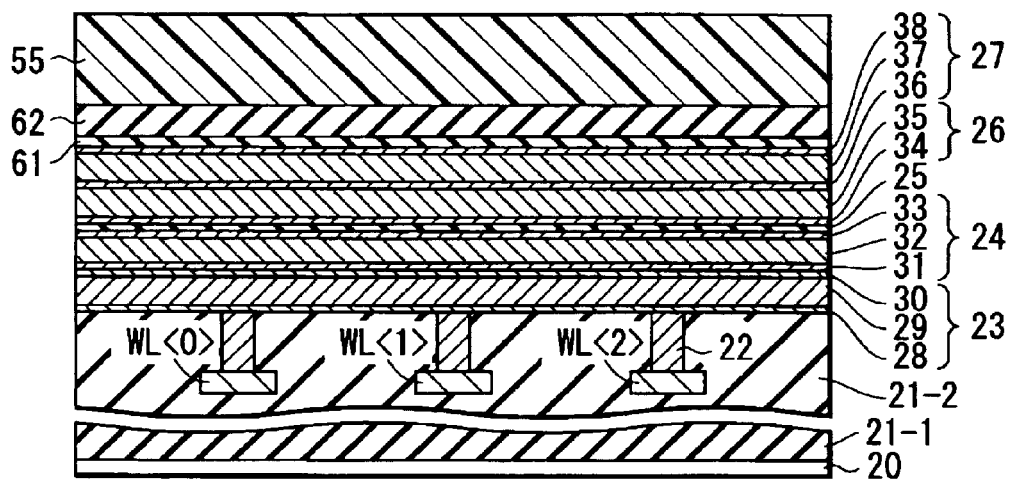
FIG. 13B is a cross-sectional view taken along the 2—2 line of FIG. 13A and viewed in the arrow direction.
Figure 13C:
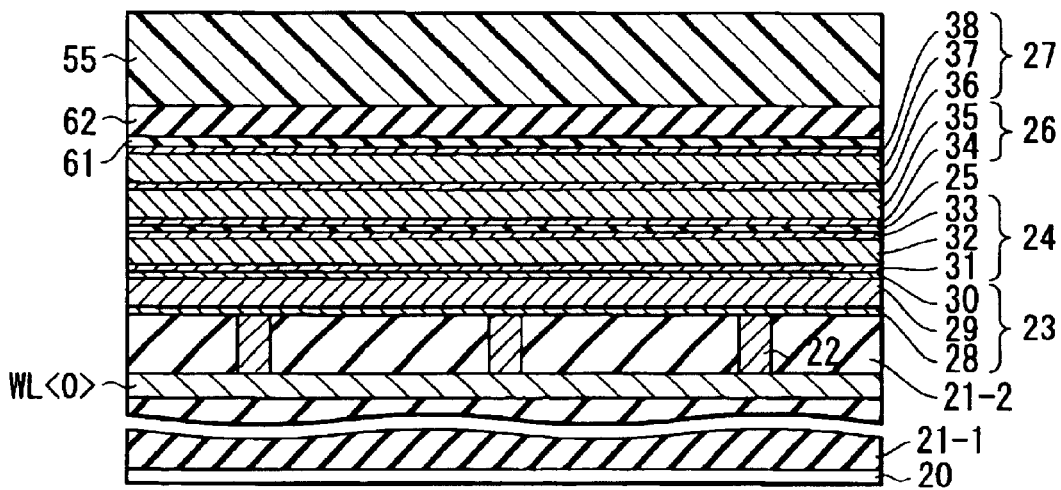
FIG. 13C is a cross-sectional view taken along the 3—3 line of FIG. 13A and viewed in the arrow direction.
Figure 14A:
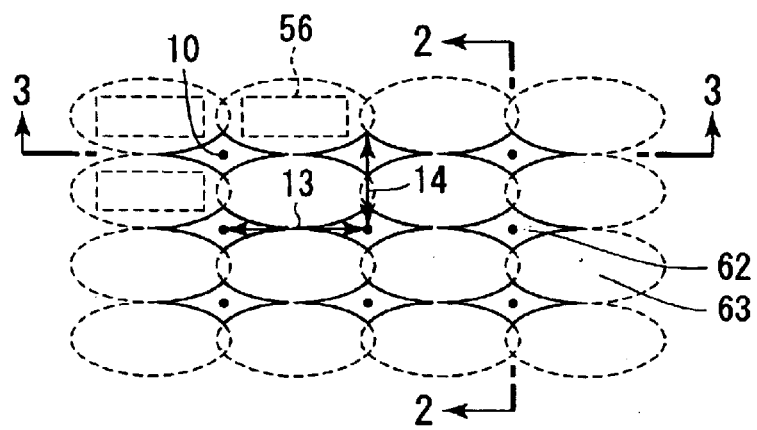
FIG. 14A is a plan view schematically showing a second step, for illustrating the manufacturing method of the magnetic memory device according to one modification of this invention.
Figure 14B:
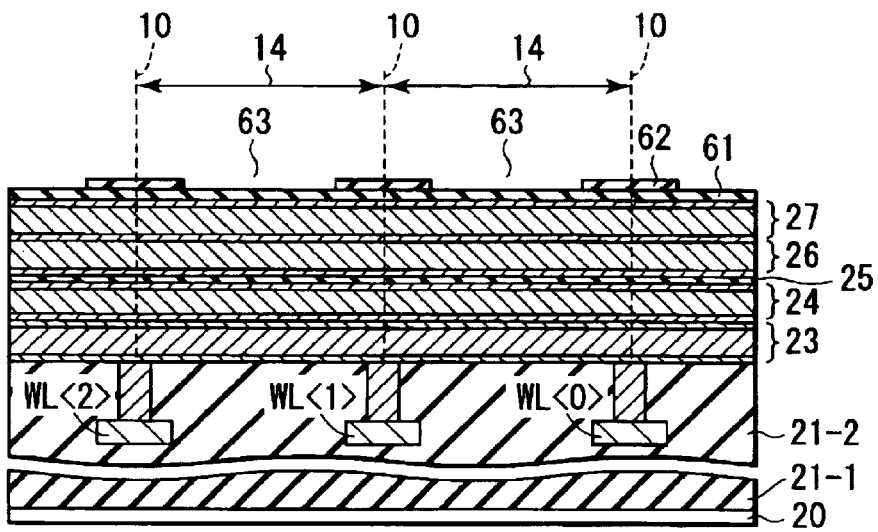
FIG. 14B is a cross-sectional view taken along the 2—2 line of FIG. 14A and viewed in the arrow direction.
Figure 14C:
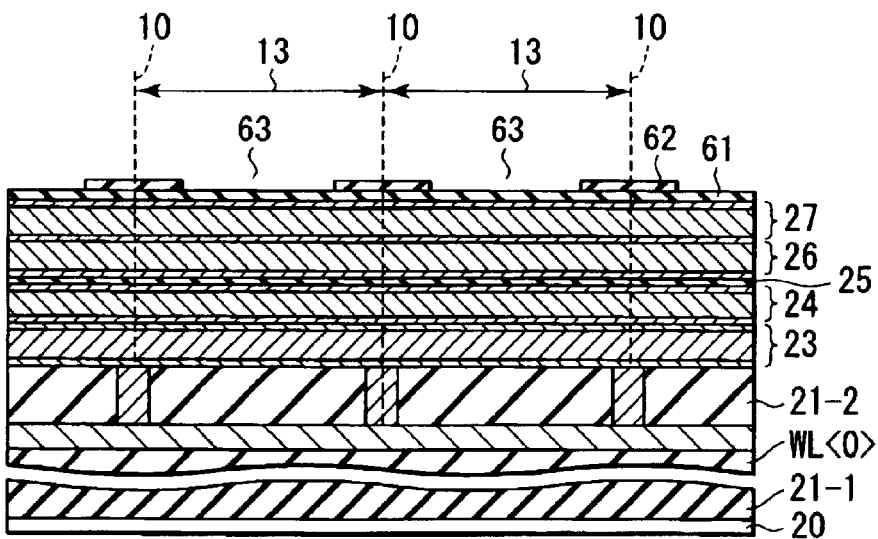
FIG. 14C is a cross-sectional view taken along the 3—3 line of FIG. 14A and viewed in the arrow direction.
Figure 15A:
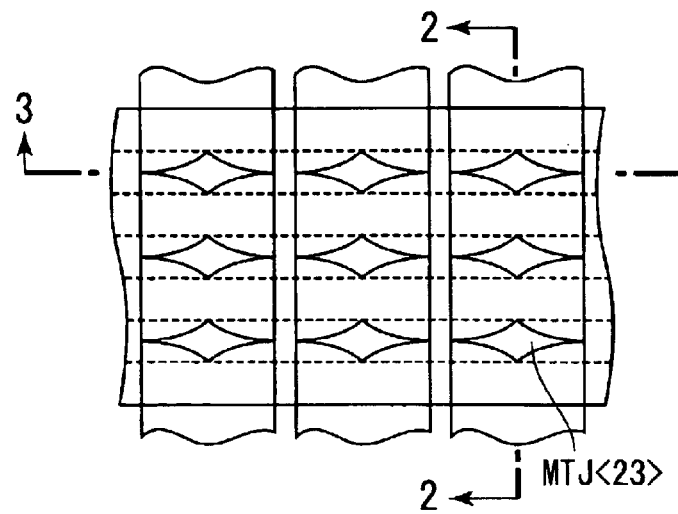
FIG. 15A is a plan view schematically showing a third step, for illustrating the manufacturing method of the magnetic memory device according to one modification of this invention.
Figure 15B:
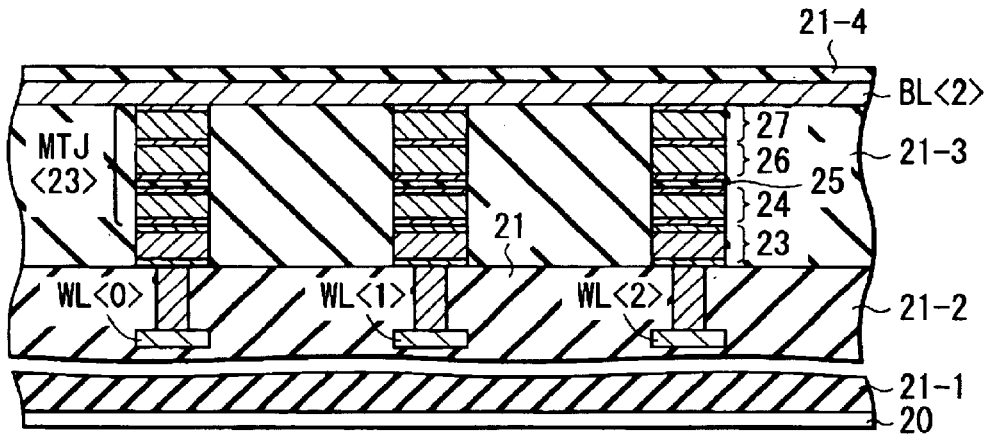
FIG. 15B is a cross-sectional view taken along the 2—2 line of FIG. 15A and viewed in the arrow direction.
Figure 15C:
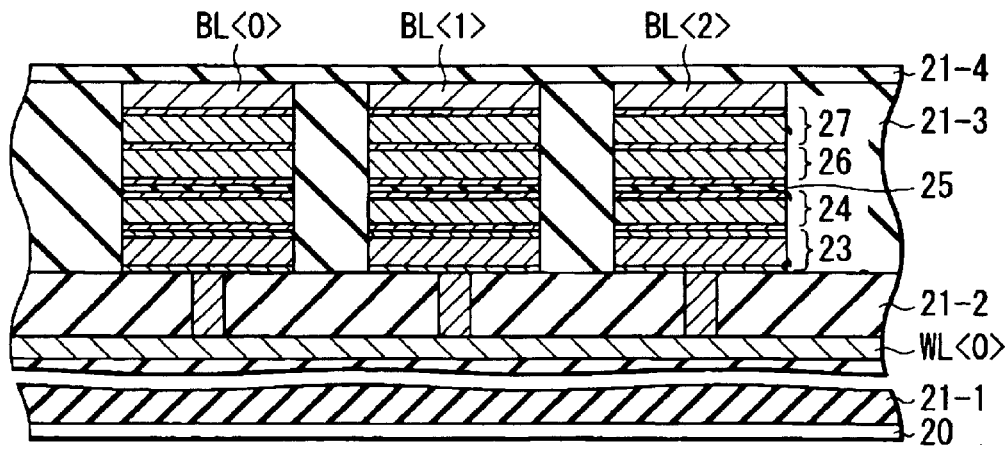
FIG. 15C is a cross-sectional view taken along the 3—3 line of FIG. 15A and viewed in the arrow direction.

FIGS. 13A, 14A and 15A are plan views schematically showing the manufacturing steps of the magnetic memory device according to the modification. FIGS. 13B, 14B and 15B are cross-sectional views taken along the respective 2—2 lines of FIGS. 13A, 14A and 15A and viewed in the respective arrow directions. FIGS. 13C, 14C and 15C are cross-sectional views taken along the respective 3—3 lines of FIGS. 13A, 14A and 15A and viewed in the respective arrow directions.

First, as shown in FIGS. 13A to 13C, inter-level insulating films 21-1 and 21-2, word lines WL (WL<0> to WL<2>) and contact plugs 22 are formed on the main surface of a semiconductor substrate 20 by the same steps as in the above embodiment. Then, a ground conductive layer 23, fixing layer 24, tunnel barrier layer 25, recording layer 26 and cap layer 27 are formed on the entire surface.

After this, a first hard mask 61 is formed on the entire surface by the CVD method, for example. Further, a second hard mask 62 is formed on the entire surface of the first hard mask 61 by the CVD method, for example. Then, a photoresist 55 is formed on the entire surface of the second hard mask 62. In this case, for example, the first hard mask 61 is formed of $SiO_2$ or the like and the second hard mask 62 is formed of SiN or the like.

Further, opening portions 57 are formed in the photoresist 55 by use of rectangular mask patterns 56 by the same steps as in the above embodiment. At this time, the actual shape of the opening portion 57 becomes almost equal to an elliptic cylinder shape 58. For example, opening portions 63 which have the same shape as the opening portions 57 formed in the photoresist are formed in the second hard mask 62 by the RIE method by using the photoresist 55 as a mask.

Next, as shown in FIGS. 14A to 14C, after the photoresist 55 is removed by ashing, the opening portions 63 formed in the second hard mask 62 are isoltropically etched by use of the CVD method, for example. In this step, the opening portions 63 formed in the second hard mask 62 and having the elliptic cylinder shape are isoltropically enlarged. As a result, at least the two end portions in the major axis direction and the two end portions in the minor axis direction of the opening portion 63 overlap with the end portions of the major and minor axes of the adjacent openings 63.

By the above process, portions of the second hard mask 62 each having a shape which is internally concaved with respect to the ellipse having the major and minor axes of the MTJ element as the major and minor axes thereof are left behind.

Next, as shown in FIGS. 15A to 15C, the first hard mask 61 is etched by the RIE method, for example, with the second hard mask 62 used as a mask. Further, the cap layer 27, recording layer 26, tunnel barrier layer 25, fixing layer 24 and ground conductive layer 23 used to form the MTJ elements are sequentially etched by the RIE method, for example, with the first hard mask 61 used as a mask.

Then, the hard masks 62 and 61 used as the mask are removed. After this, for example, an $SiO_2$ film or the like is formed as an inter-level insulating film 21-3 on the entire surface by the CVD method, for example. Further, the inter-level insulating film 21-3 is made flat by the CMP method, for example. Then, a bit line BL<2> is formed in the inter-level insulating film 21-3 along the column direction of the MTJ elements. Further, an inter-level insulating film 21-4 is formed on the entire surface by the CVD method, for example.

By the above manufacturing process, the magnetic memory device according to the modification can be formed.

As shown in FIGS. 14A to 14C, after the photoresist 55 is removed by ashing, the opening portions 63 formed in the second hard mask 62 are isoltropically etched by use of the CVD method, for example. By the above step, portions of the second hard mask 62 each having a shape obtained by internally concaving the ellipse which has the major and minor axes of the MTJ element as the major and minor axes thereof are left behind.

By the above manufacturing process, portions of the second hard mask 62 each having the shape which is internally concaved with respect to the ellipse having the major and minor axes of the MTJ element as the major and minor axes thereof are formed by the CDE method. At this time, a magnetic material or the like used to form the MTJ elements is not exposed. That is, in the above process, since the first hard mask 61 lies under the second hard mask 62, the laminated film (cap layer 27) used to form the MTJ elements is not exposed. Therefore, since a bad influence by oxidation or the like in the above process on the MTJ elements can be prevented and the optimum condition for the CDE method can be easily set, the shape controllability can be enhanced. As a result, a highly reliable magnetic memory device can be formed with a high yield.

In the above embodiment and modification, a case wherein the MTJ element is used as one example of the magneto-resistance effect element is explained. However, this invention is not limited to the MTJ element and a GMR (Giant Magneto-resistance) element, CMR (Colossal Magneto-resistance) element, or other magneto-resistance effect elements can be used.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic memory device comprising:
a plurality of magneto-resistance effect elements arranged in a matrix form,
wherein each of the plurality of magneto-resistance effect elements has a pattern shape which substantially internally touches an ellipse having major and minor axes of the magneto-resistance effect element as major and minor axes thereof and a pitch between the adjacent magneto-resistance effect elements in a direction of the major axis is longer than that in a direction of the minor axis.

2. A magnetic memory device according to claim 1, wherein at least part of the outer periphery of the magneto-resistance effect element has a shape which projects in an inward direction of the magneto-resistance effect element.

3. A magnetic memory device according to claim 2, wherein the sides of each magneto-resistance effect element are curved toward the center of the magneto-resistance effect element, each side extending along an arc of an ellipsis.

4. A magnetic memory device according to claim 1, wherein an area of the magneto-resistance effect element is smaller than an area of an ellipse having the major and minor axes of the magneto-resistance effect element as major and minor axes thereof.

5. A magnetic memory device according to claim 1, wherein the magneto-resistance effect element includes a fixing layer, tunnel barrier layer, recording layer and cap layer.

6. A magnetic memory device according to claim 1, further comprising first write wirings formed below the magneto-resistance effect elements and second write wirings formed on the magneto-resistance effect elements to intersect with the first write wirings.

* * * * *